United States Patent
Jung et al.

(10) Patent No.: US 11,726,134 B2
(45) Date of Patent: Aug. 15, 2023

(54) SUBSTRATE INSPECTION DEVICE AND SUBSTRATE INSPECTION METHOD

(71) Applicant: JUSUNG ENGINEERING CO., LTD., Gwangju-Si (KR)

(72) Inventors: Gu Hyun Jung, Gwangju-Si (KR); Young Rok Kim, Gwangju-Si (KR); Se Yong Oh, Gwangju-Si (KR); Chul Joo Hwang, Gwangju-Si (KR); Jin An Jung, Gwangju-Si (KR)

(73) Assignee: JUSUNG ENGINEERING CO., LTD.

( * ) Notice: Subject to any disclaimer, the term of this patent is extended or adjusted under 35 U.S.C. 154(b) by 120 days.

(21) Appl. No.: 16/959,145

(22) PCT Filed: Dec. 27, 2018

(86) PCT No.: PCT/KR2018/016696
§ 371 (c)(1),
(2) Date: Jun. 29, 2020

(87) PCT Pub. No.: WO2019/132528
PCT Pub. Date: Jul. 4, 2019

(65) Prior Publication Data
US 2020/0341049 A1 Oct. 29, 2020

(30) Foreign Application Priority Data

Dec. 27, 2017 (KR) .................. 10-2017-0181351
Dec. 26, 2018 (KR) .................. 10-2018-0169241

(51) Int. Cl.
*G01R 31/26* (2020.01)
*G01R 1/04* (2006.01)
*G01R 31/265* (2006.01)

(52) U.S. Cl.
CPC .......... *G01R 31/2601* (2013.01); *G01R 1/04* (2013.01); *G01R 31/265* (2013.01)

(58) Field of Classification Search
CPC ............. H01L 21/673; H01L 21/67242; H01L 21/67253; H01L 21/67288; H01L 21/687;
(Continued)

(56) References Cited

U.S. PATENT DOCUMENTS 6,819,416 B2     11/2004  Maeda et al.
6,927,847 B2 *    8/2005  Yoshida ........... G01N 21/95684
                                                          356/237.4
(Continued)

FOREIGN PATENT DOCUMENTS

JP        H04733 A         1/1992
JP        2001196302 A     7/2001
(Continued)

OTHER PUBLICATIONS

Written Opinion for PCT/KR2018/016696 dated Jul. 9, 2019.
International Search Report for PCT/KR2018/016696 dated Apr. 3, 2019.

*Primary Examiner* — Huy Q Phan
*Assistant Examiner* — David B Frederiksen
(74) *Attorney, Agent, or Firm* — Renaissance IP Law Group LLP

(57) ABSTRACT

Provided are a device and a method for monitoring substrates to determine a processed state of the substrates and inspecting presence of abnormality in the processed substrates.
A device for inspecting substrates includes a substrate mounting part moving relative to the substrate and for mounting a substrate, a measurement part for monitoring the substrate, a control part configured to control a movement path of the measurement part so that at least some regions are monitored from positions different from each other with respect to a plurality of substrates, and an analysis part
(Continued)

configured to determine presence of abnormality from monitoring information about the plurality of substrates.

18 Claims, 5 Drawing Sheets

(58) Field of Classification Search
CPC .............. H01L 21/68714; G01R 31/26; G01R 31/2601; G01R 1/04
See application file for complete search history.

(56) References Cited

U.S. PATENT DOCUMENTS

| | | | |
|---|---|---|---|
| 10,067,067 B2* | 9/2018 | Lee | G01N 21/8806 |
| 2004/0208353 A1* | 10/2004 | Murakami | G01N 21/956 |
| | | | 382/145 |
| 2005/0200841 A1 | 9/2005 | Talbot et al. | |
| 2007/0177136 A1* | 8/2007 | Nakano | H01L 22/12 |
| | | | 257/E21.53 |
| 2008/0204736 A1* | 8/2008 | Chikamatsu | G01N 21/9501 |
| | | | 356/237.4 |
| 2010/0182589 A1* | 7/2010 | Hirose | G01N 21/95607 |
| | | | 356/51 |
| 2010/0265496 A1* | 10/2010 | Nakano | G01N 21/94 |
| | | | 382/149 |
| 2011/0052040 A1* | 3/2011 | Kuan | H01L 22/12 |
| | | | 382/145 |
| 2011/0310244 A1* | 12/2011 | Schweitzer | G01N 21/896 |
| | | | 348/92 |
| 2015/0276623 A1* | 10/2015 | Urano | G01N 21/956 |
| | | | 356/369 |
| 2015/0286001 A1* | 10/2015 | Konno | G01N 21/00 |
| | | | 348/95 |
| 2016/0261786 A1 | 9/2016 | Ahn et al. | |
| 2019/0131156 A1* | 5/2019 | Seo | H01L 21/67259 |
| 2019/0162756 A1* | 5/2019 | Utsumi | G01R 31/2844 |

FOREIGN PATENT DOCUMENTS

| | | |
|---|---|---|
| JP | 2003254741 A | 9/2003 |
| JP | 2008103710 A | 5/2008 |
| JP | 4247076 B2 * | 4/2009 |
| JP | 2009188175 A | 8/2009 |
| JP | 2016076611 A | 5/2016 |
| KR | 20120133589 A * | 12/2012 |
| KR | 20120133589 A | 12/2012 |
| KR | 20160028954 A | 3/2016 |
| KR | 20160116534 A | 10/2016 |
| KR | 20170068419 A | 6/2017 |
| TW | 201213794 A | 4/2012 |
| TW | I420096 B | 12/2013 |

* cited by examiner (a)　　　　　　　　(b)

(a)  (b)

SUBSTRATE INSPECTION DEVICE AND SUBSTRATE INSPECTION METHOD

TECHNICAL FIELD

The present disclosure herein relates to a device and a method for inspecting substrates, and more particularly, to a device and a method for monitoring substrates to determine processed states of the substrates and inspecting presence of abnormality in the processed substrates.

BACKGROUND ART

Semiconductor devices are manufactured by forming various shapes of pattern layers on substrates such as wafers, and in order to form such pattern layers, in general, a predetermined pattern layers are laminated by using chemical vapor deposition (CVD) or physical vapor deposition (PVD).

In addition, even after the process of laminating the pattern layers, in order to patterning the laminated pattern layers in a desired shape, a process of etching the pattern layer by using a photoresist as a mask and a process of stripping the photoresist are performed.

Meanwhile, according to reduction of design rules, semiconductor manufacturing processes may be operating closer to limits of performance capability of the processes. Moreover, in some cases of smaller design rules, processes causing a failure tend to be systematic. That is, a process causing a failure tends to cause the failure in predetermined design patterns which are repeated a plurality of times among the above design. It is important to detect and remove spatially systematic and electrically related defects, and this is because the removal of such defects very comprehensively affects a yield.

Thus, it is urgent to speed up the substrate inspection for determining the processed state of a substrate corresponding to technological advance due to rapidly developing production technology for semiconductor devices and an increase in demand for high density integration and semiconductor devices.

RELATED ART DOCUMENTS (Patent document 1) KR10-2017-0068419 A

Technical Problem

The present disclosure provides a device and a method for inspecting substrates capable of inspecting processed states and presence of abnormality at high speed.

Technical Solution

In accordance with an exemplary embodiment, a device for inspecting substrates includes: a substrate mounting part moving relative to the substrate and for mounting a substrate; a measurement part for monitoring the substrate; a control part configured to control a movement path of the measurement part so that at least some regions are monitored from positions different from each other with respect to a plurality of substrates; and an analysis part configured to determine presence of abnormality from monitoring information about the plurality of substrates.

The plurality of substrates may be selected from substrates for which a same predetermined process has been performed.

The device for inspecting substrates may further include a support part installed over the substrate mounting part, wherein the measurement part may be installed under the support part so as to be movable in one direction.

At least one of the substrate mounting part and the support part may be installed so as to be rotatable around a center axis of the substrate.

The control part may perform control so that the measurement part has a linear movement path.

The control part may perform control so that the measurement part has a movement path via a central portion of the substrate.

The control part may perform control so that the measurement part has a movement path bent at the central portion of the substrate.

The control part may perform control so that the movement path of the measurement part has a length not greater than a diameter of the substrate.

The substrate mounting part may be installed in a loadlock chamber configured to store the plurality of substrates which are transported from a process chamber in which the predetermined process is performed, or be installed in a front end module (EFEM) connected to the loadlock chamber and configured to discharge the plurality of substrates.

In accordance with another exemplary embodiment, a method for inspecting substrates includes: selecting a first substrate and a second substrate from among a plurality of substrates; monitoring some regions of the first substrate; monitoring some regions of the second substrate; and determining presence of abnormality from monitoring information about the first substrate and the second substrate.

In the selecting of the first substrate and the second substrate, the first substrate and the second substrate may be selected from among a plurality of substrates belonging to one lot.

In the selecting of the first substrate and the second substrate, the first substrate and the second substrate may be selected from among a plurality of substrates for which a predetermined process is performed in a same chamber.

In the monitoring of some regions of the second substrate, at least some regions of a monitoring region of the second substrate and at least some regions of a monitoring region of the first substrate may be different each other.

The monitoring of some regions of the first substrate may be performed by moving a measurement part, for monitoring the first substrate, relative to the first substrate in a first direction via a central portion of the substrate.

The monitoring of some regions of the second substrate may be performed by moving a measurement part, for monitoring the second substrate, relative to the second substrate in a second direction, which is different from the first direction, via the central portion of the substrate.

In the determining of presence of abnormality, when the monitoring information about the first substrate and the information about the second substrate both fall within an error range, a processed state may be determined to be good.

In the determining of presence of abnormality, when a monitoring region of the first substrate and a monitoring region of the second substrate partially overlap, the error range may be corrected by using a deviation in monitoring information about an overlapping region.

Advantageous Effects

In accordance with a device and a method for inspecting substrates of an exemplary embodiment, at least some regions are monitored from position different from each other with respect to a plurality of substrates, and thus, the processed states of the substrates may be determined in short time and the time consumed for inspection may be reduced.

Accordingly, an instantaneous feedback may be provided in response to the processed state, and a pre-action, such as operation stop, improvement, or maintenance, is taken due to equipment abnormality, and thus, a defect rate is minimized during manufacturing of substrates, and the capacity utilization of equipment may be improved.

DESCRIPTION

Figure 1:
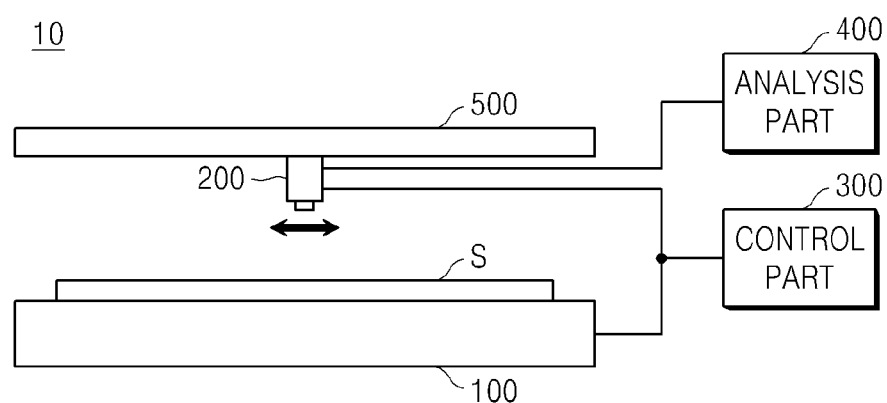
FIG. 1 is a schematic view illustrating a device for inspecting substrates in accordance with an exemplary embodiment.

Exemplary embodiments of the present invention will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. In the figures, like reference numerals refer to like elements throughout.

FIG. 1 is a schematic view illustrating a device for inspecting substrates in accordance with an exemplary embodiment, and FIGS. 2 to 5 are views illustrating states in which a substrate is monitored in accordance with en exemplary embodiment. In addition, FIG. 6 is a view for describing a state in which presence of abnormality is determined in accordance with an exemplary embodiment.

Referring to FIGS. 1 to 6, a device 10 for inspecting substrates in accordance with an exemplary embodiment includes: a substrate mounting part 100 for mounting a substrate S; a measurement part 200 for monitoring the substrate S by moving relative to the substrate S; a control part 300 which controls a movement path of the measurement part 200 so that at least some regions are monitored at positions different from each other with respect to a plurality of substrates; and an analysis part 400 which determines presence of abnormality from monitoring information of the plurality of substrates.

The substrate mounting part 100 mounts the substrate S to be monitored. Here, the device 10 for inspecting substrates in accordance with an exemplary embodiment monitors the substrate S for which a predetermined process such as a lamination process has been performed and determines the processed state to inspect the presence of abnormality. The substrate S may include a dummy substrate which is not a substrate manufactured for actual use but for monitoring only, and a thin film without a pattern formed thereon may be deposited on the dummy substrate. Of course, such a dummy substrate may be reused in a later monitoring process after the monitoring is completed.

In addition, the device 10 for inspecting substrates in accordance with an exemplary embodiment may also monitor the substrate S for which processes such as an etching process and a strip process have been performed, and at this point, the substrate S on which a pattern has been formed by the above-mentioned processes may be mounted on the substrate mounting part 100.

The substrate mounting part 100 may be provided to a loadlock chamber to store a plurality of substrates which are transported from a process chamber in which the above-mentioned predetermined processes are performed, or be provided to an equipment front end module (EFEM) connected to the loadlock chamber in order to discharge the substrates stored in the loadlock chamber. Here, when the substrate mounting part 100 is provided to the loadlock chamber, the substrate mounting part 100 may include at least one slot among the plurality of slots installed in the loadlock chamber. In addition, when the substrate mounting part 100 is provided to the front end module, the substrate mounting part 100 may be provided to a portion of the space inside the front end module. An exemplary embodiment, in which the substrate mounting part 100 is provided to the loadlock chamber or to the front end module, will be described with reference to FIG. 7.

The measurement part 200 is installed on the substrate mounting part 100 and monitors the substrate S. Here, the measurement part 200 moves relative to the substrate S. That is, the measurement part 200 is movably installed and the position of the substrate mounting part 100 is fixed, and thus, not only the measurement part 200 may move relative to the substrate S, but also the position of the measurement part 200 may be fixed, the substrate mounting part 100 may be movably installed, and the measurement part 200 may thereby also move relative to the substrate S. Hereinafter, a case in which the measurement part 200 is movably installed will be described as an example, but also in a case in which the substrate mounting part 100 is moved and the measurement part 200 thereby moves relative to the substrate S, the exemplary embodiment may, of course, be equally applied.

Here, the measurement part 200 monitors the thickness and reflectivity of the substrate S, and the presence and distribution range of particles, and the like. To this end, the measurement part 200 may be composed of various units for measuring a distance from the substrate S, an image of the substrate S, a spectrum, and resistance value, and the units for measuring the thickness, reflectivity, and presence of particles, distribution range, and the like, of the substrate S are variously well known, and the detailed description thereon will be omitted.

The measurement part 200 may be installed under a support part 500 so as to be movable in one direction. That is, the device 10 for inspecting substrates in accordance with an exemplary embodiment may further include a support part 500 installed at a position spaced apart a predetermined distance above the substrate mounting part 100, and the measurement part 200 may be movably installed under the support part 500, for example, on a lower surface so as to be movable in one direction. A configuration, in which various movement paths are formed by the measurement part 200 which moves in the one direction under the support part 500, will be described later with reference to FIGS. 2 to 5.

The control part 300 controls the movement path of the measurement part 200 so that at least some regions are monitored at positions different from each other with respect to a plurality of substrates for which predetermined processes such as a lamination process, an etching process, and a stripping process have been performed.

Here, a device 10 for inspecting substrates in accordance with an exemplary embodiment monitors each of the plurality of substrates selected from substrates for which the same predetermined process has been performed, and uses the fact that the monitoring information obtained for a first substrate among the plurality of substrates may be directly applied to a second substrate among the plurality of substrates, and conversely, the monitoring information obtained for the second substrate among the plurality of substrates may be applied to the first substrate among the plurality of substrates. Here, the plurality of substrates selected from substrates for which the same predetermined process has been performed may be the entirety of the substrates on which the predetermined process has been performed, and also be a portion of the substrates among the substrates on which the predetermined process has been performed.

Thus, the control part 300 controls the movement path of the measurement part 200 so that at least some regions are monitored at positions different from each other with respect to the plurality of such substrates. Here, the control part 300 may control the movement path of the measurement part 200 so that at least some regions may be monitored at positions different from each other with respect to notches each formed on edges of the plurality of substrates. Here, the notches N are generally used to distinguish upper and lower surfaces of a substrate, to determine whether the substrate has rotated, and determine the angle or direction of the rotation. Positions different from each other in a plurality of substrates means the positions different from each other when each of the notches N are located at the same position and are superposed with respect to the plurality of substrates as illustrated in FIG. 6.

In addition, the control part 300 may also control the movement path of the measurement part 200 so that the substrates are monitored at positions different from each other, but some regions may be monitored at an overlapped position, and the other regions may be monitored at positions different from each other. As such, when the regions being monitored partially overlap with respect to the plurality of substrates, the processed state of each substrate may be compared by using the monitoring information of the overlapped region, and as described later, an error range or the like may be corrected for determining presence of abnormality by using the deviation in the monitoring information of the overlapped region.

Hereinafter with reference to FIGS. 2 to 5, exemplary embodiments, in each of which the control part 300 controls the movement path of the measurement part 200 and monitors each of the plurality of substrates, will be described in detail. In FIGS. 2 to 5, dotted arrows mean the movement path of the measurement part 200.

Figure 2:
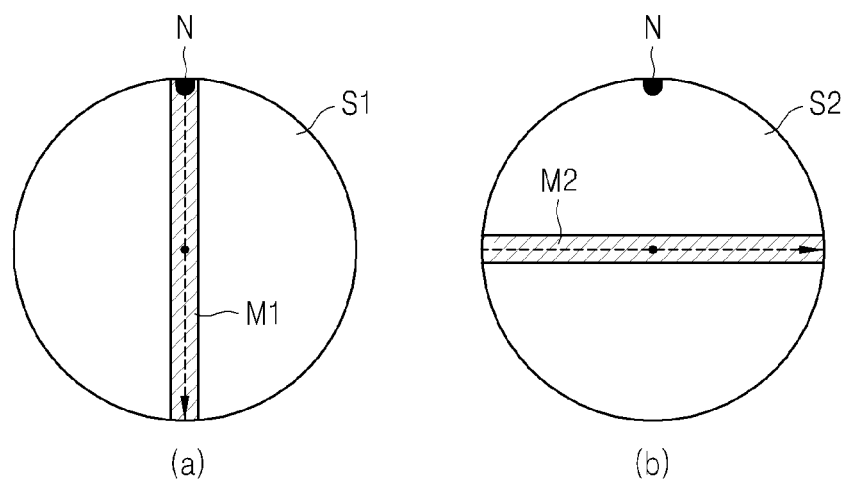
FIGS. 2 to 5 are views illustrating states in which a substrate is monitored in accordance with exemplary embodiments.

As illustrated in FIG. 2, the control part 300 moves the measurement part 200 in different directions with respect to a first substrate and a second substrate included in a plurality substrates, and thereby allows at least some regions to be monitored at different positions from each other. Here, the different directions from each other mean, for example, directions different from each other when each of the substrates is disposed so that the notch N is located on an upper portion.

That is, the control part 300 may move the measurement 200, with respect to the first substrate S1, from an upper edge of the substrate to a lower edge of the first substrate S1 and form a first monitoring region M1. In addition, the control part 300 moves, with respect to the second substrate S2, the measurement part 200 from a left edge of the substrate to a right edge of the second substrate S2 to form a second monitoring region M2. As such, in order to move the measurement part 200 in directions different from each other, at least one of the substrate mounting part 100 and the support part 500 may be installed to be rotatable around the center axis of the substrate. That is, the control part 300 moves the measurement part 200 form the upper edge of the first substrate to the lower edge in one direction to form the first monitoring region M1. Subsequently, at least one of the substrate mounting part 100 and the support part 500 is rotated 90°, and the measurement part 200 is moved in one direction from the left edge of the second substrate to the right edge to form the second monitoring region M2. In this case, the movement paths of the measurement part 200 with respect to the first substrate and the second substrate may have the same length as the diameters of the first substrate and the second substrate.

Figure 3:
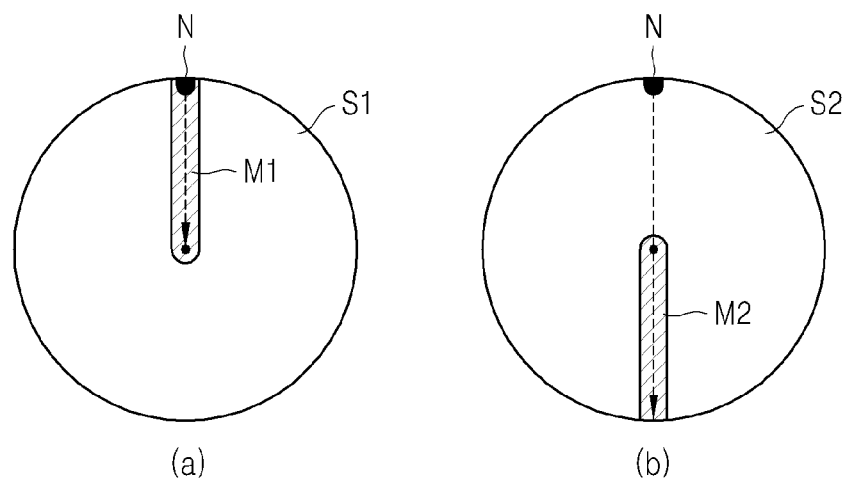

In addition, as illustrated in FIG. 3, the control part 300 may move the measurement 200, with respect to the first substrate S1, from the upper edge of the substrate to the central portion of the first substrate S1 to form a first monitoring region M1. In addition, the control part 300 may move the measurement part 200, with respect to the second substrate S2, from the central portion of the substrate to the lower edge of the second substrate S2 and form a second monitoring region M2. In this case, the substrate mounting part 100 and the support part 500 are not required to rotate, and the control part 300 adjusts only the length of the movement path of the measurement part 200, and the movement path of the measurement part 200 with respect to the first substrate and the second substrate has the same length as the radii of the first substrate and the second substrate which are smaller than the diameters of the first substrate and the second substrate.

Figure 4:
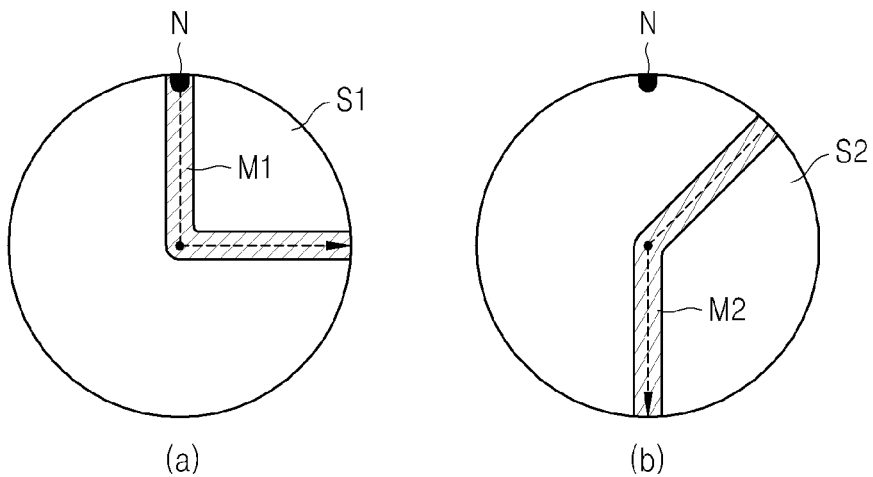

In addition, as illustrated in FIG. 4, the control part 300 may move, with respect to the first substrate S1, the measurement part 200 from the upper edge of the first substrate S1 to the central portion of the first substrate, and move the measurement part 200 from the central portion of the first substrate S1 to the right edge of the first substrate S1 again to form the first monitoring region M1. In addition, the control part 300 may move, with respect to the second substrate S2, the measurement part 200 from an edge between the upper and right portions to the central portion of the substrate S2, and move the measurement part 200 from the central portion of the second substrate S2 to a lower portion of the second substrate S2 again, to form the second monitoring region M2. That is, the measurement part 200 may have the movement path bent at the central portion of the substrate. To this end, the control part 300 may move the measurement part 200 from the upper edge of the first substrate S1 to the central portion of the first substrate S1, partially rotate at least one of the substrate mounting part 100 and the support part 500, and then move the measurement part 200 from the central part of the first substrate S1 to a right edge of the first substrate S1. Subsequently, the control part 300 may partially rotate the substrate mounting part 100 to move measurement part 200 from an edge between an upper portion and right portion to the central portion of the second substrate S2, and rotate the substrate mounting part 100 again to move the measurement part 200 from the central portion of the second substrate S2 to a lower portion of the second substrate S2. In this case, the movement paths of the measurement part 200 with respect to the first substrate and the second substrate may have the same length as the diameters of the first substrate and the second substrate.

Furthermore, the measurement part 200 may be configured so as not to perform monitoring in the entirety of region along the movement path, but to perform the monitoring only at a specific position. That is, the measurement part 200 may monitor a specific position inside the first substrate S1 and the second substrate S2, and in this case, the special position may be one or a plurality of positions located at the central portion of the substrate of located outside the central portion.

Figure 5:
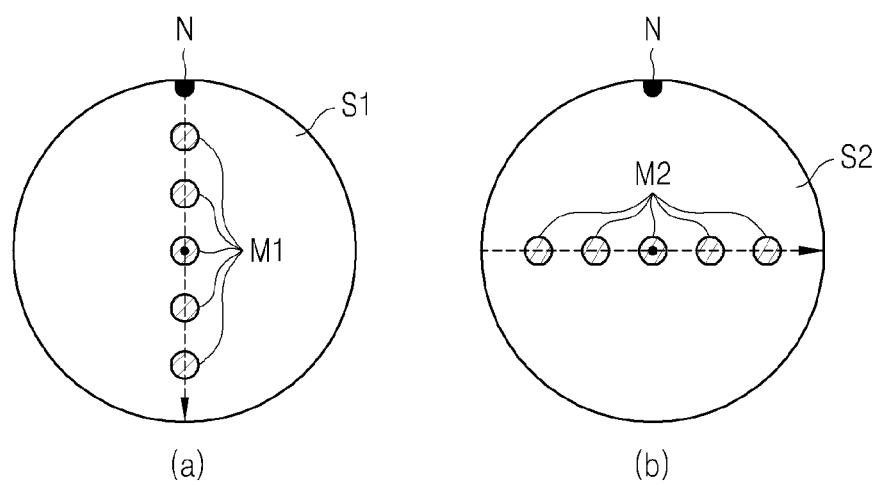
Figure 6:
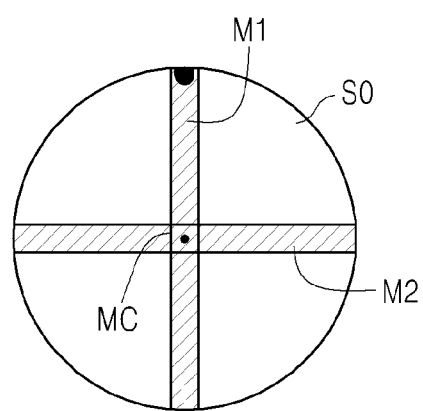
FIG. 6 is a view for describing a state in which presence of abnormality is determined in accordance with an exemplary embodiment.

As illustrated in FIG. 5, when the measurement part 200 monitors a plurality of positions, the measurement part 200 moves, for example, along the movement path as in FIG. 2 on the first substrate S1 and the second substrate S2, and a position or an interval is designated on the movement path and thus, monitoring may be performed only at the specific positions M1 and M2. That is, the measurement part 200 may intermittently monitor each substrate on the movement paths of the first substrate S1 and the second substrate S2. Here, FIG. 5 illustrates that each substrate is monitored at specific positions M1 and M2 each including five positions, but the number of the monitored positions is not limited thereto. However, it may also be configured such that three specific positions including the central portion are monitored on the first substrate S1, and a different movement path of the measurement part 200 is set to monitor three specific positions including the central position on the second substrate S2, and in this case, when the first substrate S1 and the second substrate S2 are superposed, a total of five specific positions may be monitored along a cross shape crossing at the central portion.

The monitoring regions M1 of the first substrate S1 and the monitoring region M2 of the second substrate are exemplarily illustrated in FIGS. 2 to 5, and each monitoring region may, of course, be variously configured so that at least some regions may be monitored at positions different from each other. However, in order to minimize the time consumed for monitoring, the control part 300 may control the measurement part 200 to have a linear movement path with a length not greater than the diameter of the substrate as illustrated in FIGS. 2 to 5, and each substrate has a characteristic symmetric about the central portion thereof, and thus, the control part may control the measurement part 200 to have a movement path via the central portion of the substrate.

In addition, in FIGS. 2 to 5, a configuration in which the measurement part 200 sequentially monitors the first substrate S1 and the second substrate S2 is exemplarily described, but the measurement part 200 in accordance with an exemplary embodiment may be provide in plurality and, of course, be configured such that one of a plurality of measurement parts 200 performs monitoring with respect to the first substrate S1, and the other measurement part 200 performs monitoring with respect to the second substrate S2.

The analysis part 400 determines presence of abnormality from monitoring information about a plurality of substrates. That is, when the monitoring information about the first substrate and the monitoring information about the second substrate both fall within the error range, the analysis part 400 determines the processed state as a good state, and when at least one of when the monitoring information about the first substrate and the monitoring information about the second substrate falls out of the error range, the analysis part determines the processed state as a defective state.

FIG. 6 illustrates a case in which the first substrate S1 and the second substrate S2 in FIG. 2 are superposed with respect to notches N at the same position. As in FIG. 6, on a virtual substrate S0 on which the first substrate S1 and the second substrate S2 are superposed, a first monitoring region M1 is formed from an upper edge of the substrate S0 to a lower edge, and a second monitoring region M2 is formed from a left edge to a right edge. As described above, a device 10 for inspecting substrates in accordance with an exemplary embodiment monitors each of the plurality of substrates selected from substrates on which the same predetermined process has been performed, so that the monitoring information obtained for a first substrate may be directly applied to a second substrate among the plurality of substrates, and conversely, the monitoring information obtained for the second substrate among the plurality of substrates may also be directly applied to the first substrate among the plurality of substrates. Thus, the substrates for which the same predetermined process has been performed may be recognized to have the same processed state as the virtual substrate S0 illustrated in FIG. 6, and the analysis part 400 determines the presence of abnormality of the processed state for the virtual substrate S0 illustrated in FIG. 6.

That is, in the first monitoring region M1 excluding a region MC at which the first monitoring region M1 and the second monitoring region M2 are superposed, the analysis part 400 determines whether the first monitoring information which has been measured by the first monitoring falls within the error range of a result value of a predetermined treatment process. In addition, in the second monitoring region M2 excluding a region MC at which the first monitoring region M1 and the second monitoring region M2 are superposed, the analysis part 400 determines whether the second monitoring information which has been measured by the second monitoring falls within the error range of a result value of the predetermined treatment process. Here, for the region MC at which the first monitoring region M1 and the second monitoring region M2 are superposed, the analysis part 400 determines the processed state as a good state when the first monitoring information and the second monitoring information both fall within the error range, and determines as a defective state when at least one of the first monitoring information and the second monitoring information both falls out of the error range.

In addition, the analysis part 400 may adjust the error range of the result value for the predetermined treatment process by using the deviation in the first monitoring information and the second monitoring information in the region MC at which the first monitoring region M1 and second monitoring region M2 are superposed. Here, the region MC at which the first monitoring region M1 and second monitoring region M2 are superposed may include the central portion of the substrate. The predetermined treatment process is mostly well performed in the central portion of the substrate, but the closer to an edge of the substrate, the higher the probability of being determined as a defect. Thus, the error range of the first monitoring region M1 is set with respect to the monitoring information about the central portion of the first substrate for which the first monitoring is performed, and error range of the second monitoring region M2 is set with respect to the monitoring information about the central portion of the second substrate for which the second monitoring is performed. At this point, the monitoring information about the central portions of the first substrate and the second substrate may be different from each other, so that in this case, the error range of the result value may be corrected by adding or subtracting the deviation in the monitoring information about the central portion of the first substrate and the second substrate to or from the monitoring information measured from any one substrate.

Figure 7:
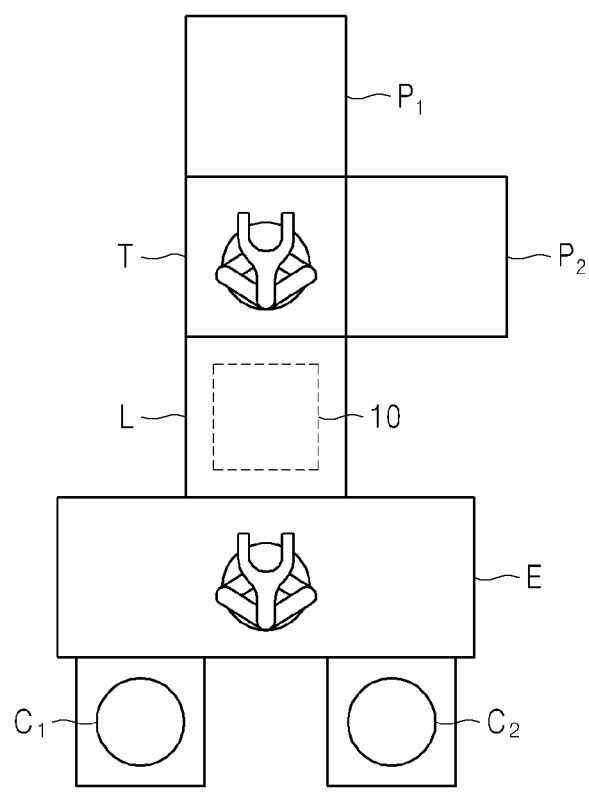
FIG. 7 is a view illustrating a state in which a device for inspecting a substrate is installed in accordance with an exemplary embodiment is installed.

FIG. 7 is a view illustrating a state in which a device for inspecting substrates in accordance with an exemplary embodiment is installed. FIG. 7 illustrates a case as an example, in which a device 10 for inspecting substrates according to an exemplary embodiment is installed in a loadlock chamber, but in a case in which the device 10 for inspecting substrates is installed in a front end module, the entirety of process may also be applied in the same manner.

As described above, a substrate mounting part 100 according to an exemplary embodiment may be transported from process chambers P1 and P2, in which a predetermined process is performed, and be provided to a loadlock chamber L, which stores a plurality of substrates, or a front end module E (EFEM) connected to a loadlock chamber L in order to discharge the substrates stored in the loadlock chamber L. Here, when the substrate mounting part 100 is provided to the loadlock chamber L, the substrate mounting part 100 may include at least one slot among the plurality of slots installed in the loadlock chamber L. Here, the measurement part 200 may also be installed inside the loadlock chamber L, but may, of course, be configured so as to be installed outside the loadlock chamber L, and perform monitoring, through a view port installed in the loadlock chamber, with respect to the substrate mounted on the uppermost stage slot among the plurality of slots installed in the loadlock chamber L. Conversely, when the substrate mounting part 100 is provided to the front end module E, the substrate mounting part 100 may be provided to a portion of a space inside the front end module E or to one side of the front end module E.

In the device for inspecting substrates, substrates are loaded on respective cassettes C1 and C2 and provided to the front end module E. In general, in the device for inspecting substrates, each of treatment processes collects a certain number of substrates and performs the corresponding process in lot units. Also, in case of a sheet-fed process, an actual process is performed by unit of one substrate, but the management thereof is performed in lot units. Thus, for example, the number of substrates in lot units may be approximately 25, and 25 substrates may be loaded on one cassette.

The substrates are provided from the front end module E to the loadlock chamber L and stored therein. The loadlock chamber L stores a portion of the substrates loaded in each of the cassettes C1 and C2, and when the substrate mounting part 100 of the device 10 for inspecting substrates is installed in the loadlock chamber L, monitoring for measuring an initial state with respect to the substrate provided to the loadlock chamber L may be performed. In this case, the analysis part 400 may, of course, compare the monitoring information about the initial state before a predetermined process is performed in the process chambers P1 and P2 and the monitoring information after the predetermined process is performed, and set an error range for determining the processed state as a good or defective state.

The substrates stored in the loadlock chamber L are transported from a transportation chamber T to respective process chambers P1 and P2. Here, the process chambers may be provided in plurality, and a plurality of substrates may simultaneously be processed inside the process chambers P1 and P2. The substrates for which a predetermined process has been performed are stored again into the loadlock chamber L. At this point, the measurement part 200 monitors the substrates, and the control part 300 controls the movement path of the measurement part 200 so that at least some regions are monitored at mutually different positions with respect to the plurality of substrates which are sequentially or simultaneously stored in the loadlock chamber L. Here, the plurality of substrates may be the entirety of the substrates stored in the loadlock chamber L, but may be the plurality of substrates selected from among the substrates included in the above-mentioned one lot. In addition, the plurality of substrates may be selected from among the substrates for which the predetermined process is performed in the same process chamber. When the plurality of substrates are selected from among the substrates included in one lot, the presence of abnormality may be determined in the entirety of the device for inspecting substrates, and in particular, when the plurality of substrates are selected from the substrates for which the predetermined process is performed inside the same process chamber, the presence of abnormality of the corresponding process chamber may easily be determined.

Here, FIG. 7 illustrates, as an example, a configuration in which a device 10 for inspecting substrates, which has one measurement part 200 is installed in a loadlock chamber L, but a plurality of devices 10 for inspecting substrates may, of course, be installed in the loadlock chamber L so as to have a plurality of measurements parts 200 to simultaneously inspect a plurality of substrates.

In addition, an analysis part 400 determines presence of abnormality in the processed state in process chambers P1 and P2 from monitoring information about the plurality of substrates which are sequentially or simultaneously stored in the loadlock chamber L. That is, when the processed state is determined to be good from the monitoring information about the plurality of substrates, the process in the process chambers P1 and P2 is continuously performed, and when the processed state is determined to be defective from the monitoring information of the plurality of substrates, it is determined that a problem occurred in the substrate processing equipment, so that the process of the substrate processing equipment may be temporarily stopped and a warning may be issued by an alarm etc, so that the corresponding chamber may be repaired and serviced.

As such, when the substrate mounting part 100 includes at least one slot from among a plurality of slots installed in the loadlock chamber L, a process for inspecting the substrate may be performed without changing the transportation path of the substrate, and it is unnecessary to adjust the sequence of a transportation robot included in a transportation chamber T. In addition, when the substrate mounting part 100 is provided to a portion of a space inside the front end module E or to a side of the front end module, there is no limitation in selecting an arbitrary substrate from the substrates for which a predetermined process is completed, and a space for installing the device 10 for inspecting substrates may easily be ensured. As such, when the substrate mounting part 100 is provided to the loadlock chamber L or to the front end module E, monitoring of the processed state of the substrate may be performed while a predetermined process for the substrate in the process chambers P1 and P2 and while minimizing influence to the movement of the substrate, in the substrate processing equipment composed of a transportation chamber T connected to the plurality of process chambers P1 and P2 and a loadlock chamber L for incoming or outgoing substrates. In addition, according to a monitoring result, a process of a specific process chamber or processes of the entirety of the substrate process equipment may be stopped, or a change in the processing process may easily be performed.

Hereinafter, a method for inspecting substrate in accordance with an exemplary embodiment will be described in detail. Here, in the method for inspecting substrates in accordance with an exemplary embodiment, descriptions about content overlapping the content of the device for inspecting substrates will be omitted.

Figure 8:
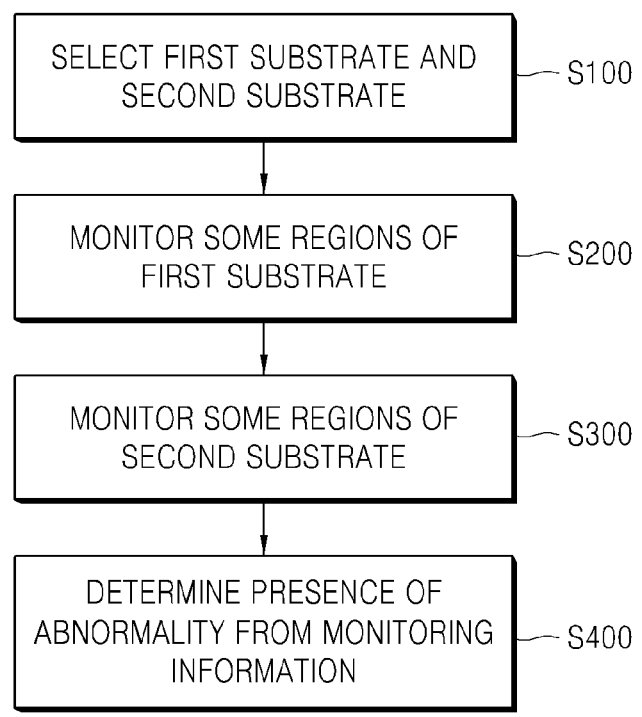
FIG. 8 is a schematic view illustrating a method for inspecting substrates in accordance with an exemplary embodiment.

FIG. 8 is a schematic view illustrating a method for inspecting substrates in accordance with an exemplary embodiment.

Referring to FIG. 8, a method for inspecting substrates in accordance with an exemplary embodiment includes: selecting a first substrate and a second substrate from among a plurality of substrates (S100); monitoring some regions of the first substrate (S200); monitoring some regions of the second substrate (S300); and determining presence of abnormality from monitoring information about the first substrate and the second substrate (S400).

In the selecting of a first substrate and a second substrate from among a plurality of substrates (S100), firstly, a first substrate and a second substrate to be monitored are selected from among a plurality of substrates for which a predetermined process is performed. Here, the first substrate and the second substrate may be selected from one cassette in which a plurality of substrates are loaded, and in this case, the first substrate and the second substrate may be selected from the plurality of substrates included in one lot, and thus presence of abnormality may be determined as the entirety of substrate processing equipment. In addition, the first substrate and the second substrate may also be selected from among a plurality of substrates for which a predetermined process is performed in the same process chamber. That is, when three to six substrates are simultaneously processed in the same process chamber, the first substrate and the second substrate may be selected from among the entirety of or a portion of the three to six substrates, and thus, presence of abnormality in the corresponding process chamber may easily be determined.

In the monitoring of some regions of the first substrate (S200), the thickness, reflectivity, presence and distribution range of particles, etc. are monitored from a measurement part 200 with respect to the portion of regions of the first substrate. Furthermore, in the monitoring of some regions of the second substrate (S300), the thickness, reflectivity, presence and distribution range of particles, etc. are monitored from the measurement part 200 with respect to the portion of regions of the second substrate.

Here, a control part 300 may control the movement path of the measurement part 200 so that at least portions of regions with respect to the first substrate and the second substrate may be monitored from positions different from each other, and thus, in the monitoring of a portion of the second substrate (S300), a monitoring region of the first substrate and at least some regions are different from each other.

In addition, the monitoring of the first substrate may be performed by moving the measurement part 200 for monitoring the first substrate in a first direction via the central portion of the first substrate, and may also be performed such that while the measurement part 200 moves in the first direction via the central portion of the first substrate, the first substrate is intermittently monitored on the movement path of the measurement part 200. In addition, the monitoring of some regions of the second substrate may be performed by moving the measurement part 200 for monitoring the first substrate in a second direction, which is different from the first direction, via the central portion of the second substrate, and may also be performed such that while the measurement part 200 moves in the second direction via the central portion of the second substrate, the second substrate is intermittently monitored on the movement path of the measurement part 200. To this end, as described above, at least one of a substrate mounting part 100 and a support part 500 may be rotatably installed around a center axis of the substrate. That is, the control part 300 may form a first monitoring region including the central portion on the first substrate by moving the measurement part 200 in the first direction, and the control part 300 may form a second monitoring region including the central portion on the second substrate by rotating at least one of the substrate mounting part 100 and the supporting part 500 to move the measurement part 200 in the second direction, which is different from the first direction.

The descriptions described above with reference to FIGS. 2 to 5 may be applied in the same manner to the monitoring of some regions of the first substrate (S200) and the monitoring of some regions of the second substrate (S300). The monitoring region of the first substrate and the monitoring region of the second substrate are exemplarily illustrated, and as described above, each of the monitoring regions may variously be configured so that at least some regions may be monitored from positions different from each other.

The determining present of abnormality from monitoring information of the first substrate and the second substrate (S400) is performed by an analysis part 400. That is, the analysis part 400 determines whether the monitoring information about some regions of the first substrate falls within an error range of a result value with respect to a predetermined treatment process. In addition, the analysis part 400 determines whether the monitoring information about some regions of the second substrate falls within the error range of a result value with respect to a predetermined treatment process. Accordingly, in the determining present of abnormality from monitoring information of the first substrate and the second substrate (S400), when any one of the monitoring information about the first substrate and the monitoring information about the second substrate falls out of the error range, the processed state is determined to be defective and notifies the substrate processing equipment of occurrence of abnormality, and when the monitoring information about the first substrate and the monitoring information about the second substrate both fall within the error range, the processed state is determined to be good, and the treatment process is continuously performed.

In addition, in determining present of abnormality from monitoring information of the first substrate and the second substrate (S400), when the monitoring region of the first substrate and the monitoring region of the second substrate partially overlap, the error range may be corrected by using a deviation in the monitoring information about the overlapping region. That is, the analysis part 400 may correct the error range of the result value for a predetermined treatment process by using the deviation in the first monitoring information and the second monitoring information in the region, such as the central portion of the substrate, at which the first monitoring region and second monitoring region are superposed. This is because the predetermined treatment process is mostly well performed in the central portion of the substrate, but the closer to an edge of the substrate, the higher the probability of being determined as defect, and since the value of a result of the predetermined treatment process is set with respect to the monitoring information about the central portion of the substrate, the error range of the result value, in this case, may be adjusted, as described above, by a value to which the deviation in the first monitoring information and the second information is added.

As such, in accordance with a device and a method for inspecting substrates of an exemplary embodiment, at least some regions are monitored from position different from each other with respect to a plurality of substrates, and thus, the processed states of the substrates may be determined in short time and the time consumed for inspection may be reduced.

Accordingly, an instantaneous feedback may be provided in response to the processed state, and a pre-action, such as operation stop, improvement, or maintenance, is taken due to equipment abnormality, and thus, a defect rate is minimized during manufacturing of substrates, and the capacity utilization of equipment may be improved.

While preferred exemplary embodiments have been described and illustrated by using specific terms, these terms are used to merely explaining the present disclosure clearly, and various modifications can be made to the embodiments and terms used without departing from the spirit and scope of the present disclosure. Such modified embodiments should not be separately understood from the spirit and scope of the present disclosure, and will be construed as being included in the claims of the present disclosure.

What is claimed is:

1. A device for inspecting substrates, the device comprising:
   a substrate mounting part for mounting a substrate;
   a measurement part moving relative to the substrate and for monitoring the substrate;
   a control part configured to control a movement path of the measurement part so that only some regions of a first substrate, and only some regions of a second substrate of which at least a portion thereof is different from the some regions of the first substrate, are monitored with respect to a plurality of substrates comprising the first substrate and the second substrate, wherein the first substrate and the second substrate are different from each other; and
   an analysis part configured to determine presence of abnormality of the plurality of substrates by determining whether monitoring information of the first substrate falls within an error range set based on the first substrate and whether monitoring information of the second substrate falls within an error range set based on the second substrate,
   wherein the analysis part configured to determine both a processed state of the first substrate and a processed state of the second substrate to be defective when at least one of the monitoring information of the first substrate or the monitoring information of the second substrate falls out of the error range by directly applying the monitoring information of the first substrate to the second substrate and directly applying the monitoring information of the second substrate to the first substrate.

2. The device of claim 1, wherein the plurality of substrates are selected from substrates for which a same predetermined process has been performed.

3. The device of claim 1, further comprising a support part installed over the substrate mounting part, wherein the measurement part is installed under the support part so as to be movable in one direction.

4. The device of claim 3, wherein at least one of the substrate mounting part and the support part is installed so as to be rotatable around a center axis of the substrate.

5. The device of claim 1, wherein the control part controls the measurement part so that the measurement part has a linear movement path.

6. The device of claim 1, wherein the control part performs control so that the measurement part has a movement path via a central portion of the substrate.

7. The device of claim 1, wherein the control part performs control so that the measurement part has a movement path bent at a central portion of the substrate.

8. The device of claim 1, wherein the control part performs control so that the movement path of the measurement part has a length not greater than a diameter of the substrate.

9. The device for inspecting substrates of claim 1, wherein the measurement part intermittently monitors the substrate on the movement path.

10. The device for inspecting substrates of claim 1, wherein the substrate mounting part is installed in a loadlock chamber configured to store the plurality of substrates which are transported from a process chamber in which a predetermined process is performed, or is installed in a front end module (EFEM) connected to the loadlock chamber and configured to discharge the plurality of substrates.

11. A method for inspecting substrates, the method comprising:
    selecting a first substrate and a second substrate, which are different from each other, from a plurality of substrates;
    monitoring only some regions of the first substrate;
    monitoring only some regions of the second substrate of which at least a portion thereof is different from the some regions of the first substrate; and
    determining presence of abnormality of the plurality of substrates by determining whether monitoring information of the first substrate falls within an error range set based on the first substrate and whether monitoring information of the second substrate falls within an error range set based on the second substrate,
    wherein, in the determining of the presence of abnormality, both a processed state of the first substrate and a processed state of the second substrate are determined to be defective when at least one of the monitoring information of the first substrate or the monitoring information of the second substrate falls out of the error range by directly applying the monitoring information of the first substrate to the second substrate and directly applying the monitoring information of the second substrate to the first substrate.

12. The method of claim 11, wherein in the selecting of the first substrate and the second substrate, the first substrate and the second substrate are selected from among a plurality of substrates belonging to one lot.

13. The method of claim 11, wherein, in the selecting of the first substrate and the second substrate, the first substrate and the second substrate are selected from among a plurality of substrates for which a predetermined process is performed in a same chamber.

14. The method of claim 11, wherein the monitoring of some regions of the first substrate is performed by moving a measurement part, for monitoring the first substrate, relative to the first substrate in a first direction via a central portion of the first substrate.

15. The method of claim 14, wherein the monitoring of some regions of the second substrate is performed by moving the measurement part, for monitoring the second substrate, relative to the second substrate in a second direction, which is different from the first direction, via the central portion of the second substrate.

16. The method of claim 14, wherein the monitoring of some regions of the first substrate is performed by intermittently monitoring the first substrate while the measurement part for monitoring the first substrate moves, and the monitoring of some regions of the second substrate is performed by intermittently monitoring the second substrate while the measurement part for monitoring the second substrate moves.

17. The method of claim 11, wherein, in the determining of presence of abnormality, when the monitoring information about the first substrate and the information about the second substrate each fall within the error range, a processed state is determined to be good.

18. The method of claim 17, wherein, in the determining of presence of abnormality, when a monitoring region of the first substrate and a monitoring region of the second substrate partially overlap, the error range is corrected by using a deviation in monitoring information about an overlapping region.

* * * * *